(12) United States Patent
Wagh et al.

(10) Patent No.: US 6,587,010 B2
(45) Date of Patent: Jul. 1, 2003

(54) MODULATED RADIO FREQUENCY SIGNAL GENERATION METHOD AND MODULATED SIGNAL SOURCE

(75) Inventors: Poojan A. Wagh, Sleepy Hollow, IL (US); Pallab Midya, Palatine, IL (US); Patrick Rakers, Kildeer, IL (US)

(73) Assignee: Motorola, Inc., Schaumburg, IL (US)

( * ) Notice: Subject to any disclaimer, the term of this patent is extended or adjusted under 35 U.S.C. 154(b) by 50 days.

(21) Appl. No.: 09/995,123

(22) Filed: Nov. 27, 2001

(65) Prior Publication Data

US 2003/0098753 A1 May 29, 2003

(51) Int. Cl.[7] ................................................ H03B 1/04
(52) U.S. Cl. ...................................... 332/105; 332/109
(58) Field of Search ................................ 332/105, 109, 332/108, 107

(56) References Cited

U.S. PATENT DOCUMENTS

| | | | | |
|---|---|---|---|---|
| 4,084,137 A | * | 4/1978 | Welti ........................... | 375/260 |
| 5,838,210 A | | 11/1998 | Midya et al. | |
| 5,880,644 A | * | 3/1999 | Schmidt et al. ............. | 332/109 |
| 6,246,738 B1 | * | 6/2001 | Acimovic et al. ..... | 375/240.03 |

OTHER PUBLICATIONS

"*Integral Noise Shaping for Quantization of Pulse Width Modulation*": Pallab Midya & Matt Miller; Motorola Labs, Schaumburg, Illinois and Mark Sandler, Kings College, London. An audio engineering society preprint, presented at the 109th Convention Sep. 22–25, 2000 in Los Angeles, California, USA.

"*Prediction Correction Algorith for Natural Pulse Width Modulation*": Pallab Midya, Bill Roeckner, Pat Rakers, & Poojan Wagh; Motorola Labs, Schaumburg, Illinois. An audio engineering society preprint, presented at the 109th Convention Sep. 22–25, 2000 in Los Angeles, California, USA.

\* cited by examiner

Primary Examiner—Robert Pascal
Assistant Examiner—Joseph Chang
(74) Attorney, Agent, or Firm—Kenneth A. Haas

(57) ABSTRACT

A modulated signal source for implementing A modulated signal method of a generating a modulated signal having a radio frequency based upon a linear mixing of signals is disclosed. An in-phase pulse signal modulator of the modulated signal source provides an in-phase pulse modulated signal in response to a reception of a baseband in-phase signal and an in-phase clock signal with the in-phase clock signal and the in-phase pulse modulated signal being synchronized. A quadrature pulse signal modulator of the modulated signal source provides a quadrature pulse modulated signal in response to a reception of a baseband quadrature signal and a quadrature clock signal with the quadrature clock signal and the quadrature pulse modulated signal being synchronized. A switch signal generator of the modulated signal source generates an in-phase switch signal and a quadrature switch signal in response to a reception of the in-phase clock signal, the in-phase pulse modulated signal, the quadrature clock signal, and the quadrature pulse modulated signal. The in-phase clock signal and the in-phase switch signal are synchronized, and the quadrature clock signal and the quadrature switch signal are synchronized. A radio frequency signal generator of the modulated signal source provides one or more modulated signals having a radio frequency in response to either a reception the in-phase switch signal and the quadrature phase signal, or a reception of a switch signal as a function of the in-phase switch signal and the quadrature phase signal.

19 Claims, 3 Drawing Sheets

MODULATED RADIO FREQUENCY SIGNAL GENERATION METHOD AND MODULATED SIGNAL SOURCE

FIELD OF THE INVENTION

In general, the present invention relates to the field of communication systems. More specifically, the present invention relates to the generation of modulated radio frequency ("RF") signals from a linear mixing of signals.

BACKGROUND OF THE INVENTION

A direct-launch modulated signal source as known in the art includes a modulation signal source having a pair of digital-to-analog converter and low-pass filter combinations for providing both an in-phase baseband signal I and a quadrature baseband signal Q in analog form. The baseband signals I and Q are thereafter mixed with clock signals from a local oscillator, and then summed whereby the baseband signals I and Q are amplitude modulated and phase modulated. Since the baseband signals I and Q are in analog form, the mixers and a receiving power amplifier of the modulation signal source must be linear. This is a disadvantage of prior art direct-launch modulated signal sources, because linear power amplifiers are power inefficient.

A LINC modulated signal source as known in the art also includes a modulation signal source having a pair of digital-to-analog converter and low-pass filter combinations for providing the baseband signals I and Q in analog form. The prior art LINC modulated signal source provides the baseband signals I and Q to a pair of LINC synthesizers in order to generate two phase signals. A pair of phase modulators receive the phase signals, respectively, in order to generate two phase-modulated constant-envelope RF signals that must be amplified with high efficiency. The two RF signals are thereafter summed to obtain a desired amplitude modulated and phase modulated signal. The drawbacks of a prior art LINC modulated signal source is a complexity of the LINC synthesizers, a wide band requirement of the phase modulators, and a power efficient requirement of the signal combiner.

Thus, there is a need for a more efficient and less complex method to modulate a baseband signal containing amplitude- and/or phase-modulation to an RF frequency.

SUMMARY OF THE INVENTION

One form of the present invention is a modulated signal method. First, a baseband signal in digital form and a clock signal are received. Second, a pulse modulated signal in digital form is provided in response to a reception of the baseband signal and a reception of the clock signal, wherein the clock signal and the pulse modulated signal are synchronized.

A second form of the present invention is a modulated signal source comprising an oscillator and a pulse signal modulator. The oscillator is operable to provide a clock signal. The pulse signal modulator is operable to provide a pulse modulated signal in digital form in response to a reception of a baseband signal and the clock signal, wherein the clock signal and the pulse modulated signal are synchronized.

The foregoing and other features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENTS

Figure 1:
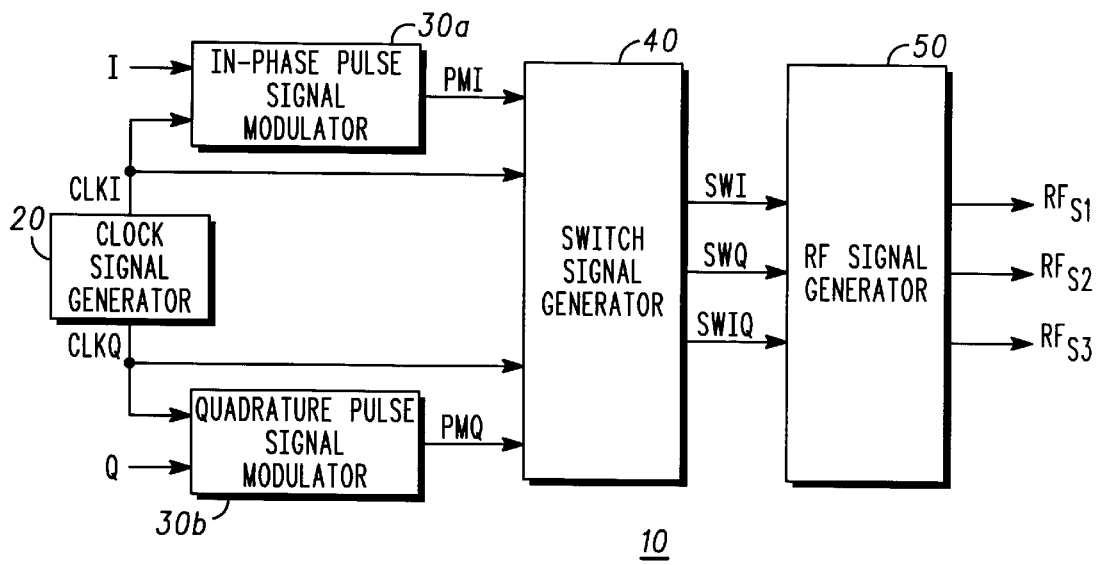
FIG. 1 illustrates a block diagram of one embodiment of a modulated signal source in accordance with the present invention.

In FIG. 1, a modulated signal source 10 in accordance with the present invention is shown. The modulated signal source 10 comprises a clock signal generator 20, an in-phase pulse signal modulator 30a, a quadrature pulse signal modulator 30b, a switch signal generator 40, and a RF signal generator 50. The modulated signal source 10, as will be appreciated by those having ordinary skill in the art from the subsequent description herein, can be employed within various communications systems and communication devices, such as, for example, cellular phones, base stations, satellites, car mobile radios, wireless network transceivers, and cable or digital subscriber line modems.

Figure 2:
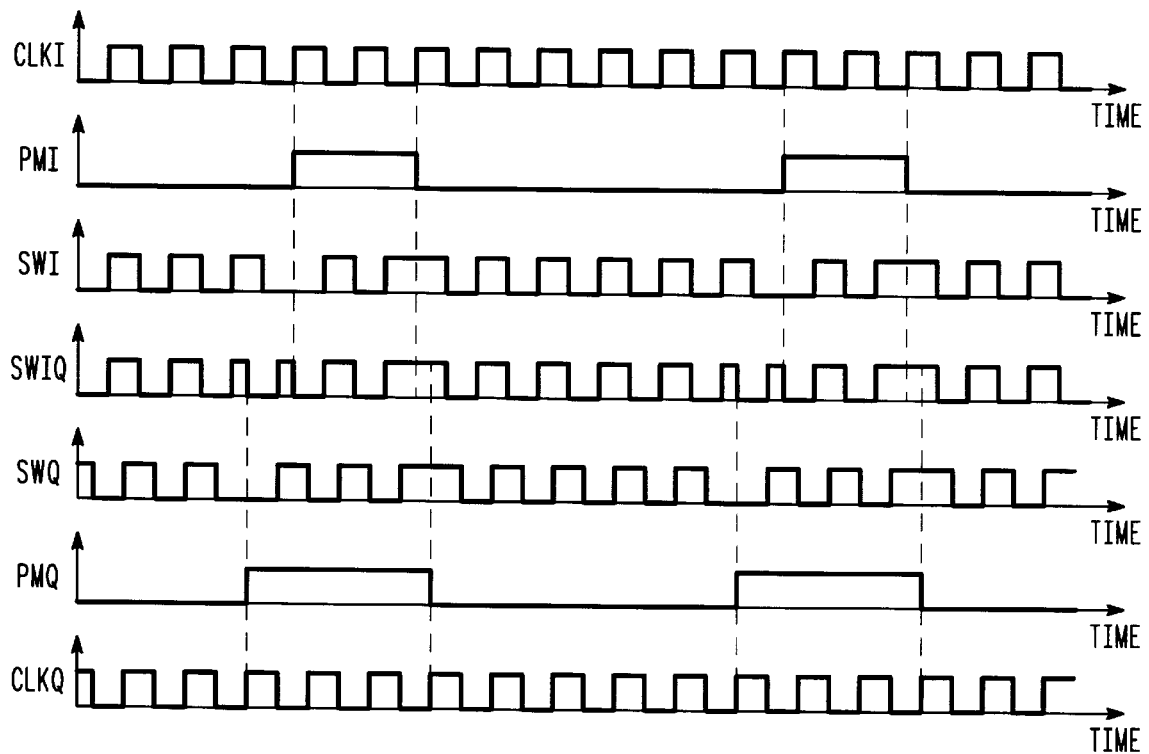
FIG. 2 illustrates an exemplary signal diagram of the modulated signal source of FIG. 1.

The clock signal generator 20 provides an in-phase clock signal CLKI in analog or digital form and a quadrature clock signal CLKQ in analog or digital form. In embodiments of the clock signal generator 20, the in-phase clock signal CLKI and the quadrature clock signal CLKQ may or may not be identical. Preferably, the CLKQ signal has a delay of a quarter cycle from the CLKI signal. FIG. 2 illustrates an exemplary in-phase clock signal CLKI in digital form and an exemplary quadrature clock signal CLKQ in digital form.

In response to the in-phase clock signal CLKI and an in-phase baseband signal I in digital form, the in-phase pulse signal modulator 30a provides an in-phase pulse modulated signal PMI in digital form that is synchronized with the in-phase clock signal CLKI. Preferably, in-phase pulse modulated signal PMI is a one-bit discrete-time, noise shaped signal having each transition edge coinciding with a transition edge of the in-phase clock signal CLKI. FIG. 2 illustrates an exemplary in-phase pulse modulated signal PMI. In response to quadrature clock signal CLKQ and a quadrature baseband signal Q in digital form, the quadrature pulse signal modulator 30b provides a quadrature pulse modulated signal PMQ in digital form that is synchronized with the quadrature clock signal CLKQ. Preferably, quadrature pulse modulated signal PMQ is a one-bit discrete-time, noise shaped signal having each transition edge coinciding with a transition edge of the quadrature clock signal CLKQ. FIG. 2 illustrates an exemplary quadrature pulse modulated signal PMQ.

In response to the in-phase pulse modulated signal PMI, the quadrature pulse modulated signal PMQ, the in-phase clock signal CLKI and the quadrature clock signal CLKQ, the switch signal generator 40 provides a switch signal SWI and a switch signal SWQ. Both the in-phase switch signal SWI and the quadrature switch signal SWQ are in digital form and are synchronized with the in-phase clock signal CLKI and the quadrature clock signal CLKQ, respectively. Preferably, each transition edge of the in-phase switch signal SWI and the quadrature switch signal SWQ coincide with a transition edge of the in-phase clock signal CLKI and the quadrature clock signal CLKQ, respectively. FIG. 2 illustrates an exemplary switch signal SWI and an exemplary switch signal SWQ.

Alternatively, the switch signal generator 40 provides a switch signal SWIQ in response to the in-phase pulse modulated signal PMI, the quadrature pulse modulated signal PMQ, the in-phase clock signal CLKI and the quadrature clock signal CLKQ. The in-phase switch signal SWIQ is in digital form and is synchronized with both the in-phase clock signal CLKI and the quadrature clock signal CLKQ. Preferably, each transition edge of the in-phase switch signal SWIQ coincides with either a transition edge of the in-phase clock signal CLKI or a transition edge of the quadrature clock signal CLKQ. FIG. 2 illustrates an exemplary switch signal SWIQ.

In response to the in-phase switch signal SWI and the quadrature switch signal SWQ, the RF signal generator 50 provides a modulated signal $RF_{S1}$ containing in-phase information corresponding to the baseband signal I and a modulated signal $RF_{S2}$ containing quadrature information corresponding to the baseband signal Q. Alternatively, in response to the in-phase switch signal SWIQ, the RF signal generator 50 provides a modulated signal $RF_{S3}$ containing in-phase information and quadrature information corresponding to the baseband signal I and the baseband signal Q, respectively. Preferably, the modulated signal $RF_{S1}$, the modulated signal $RF_{S2}$, and the modulated signal $RF_{S3}$ are generated at a frequency of at least 500 kHz.

Figure 3:
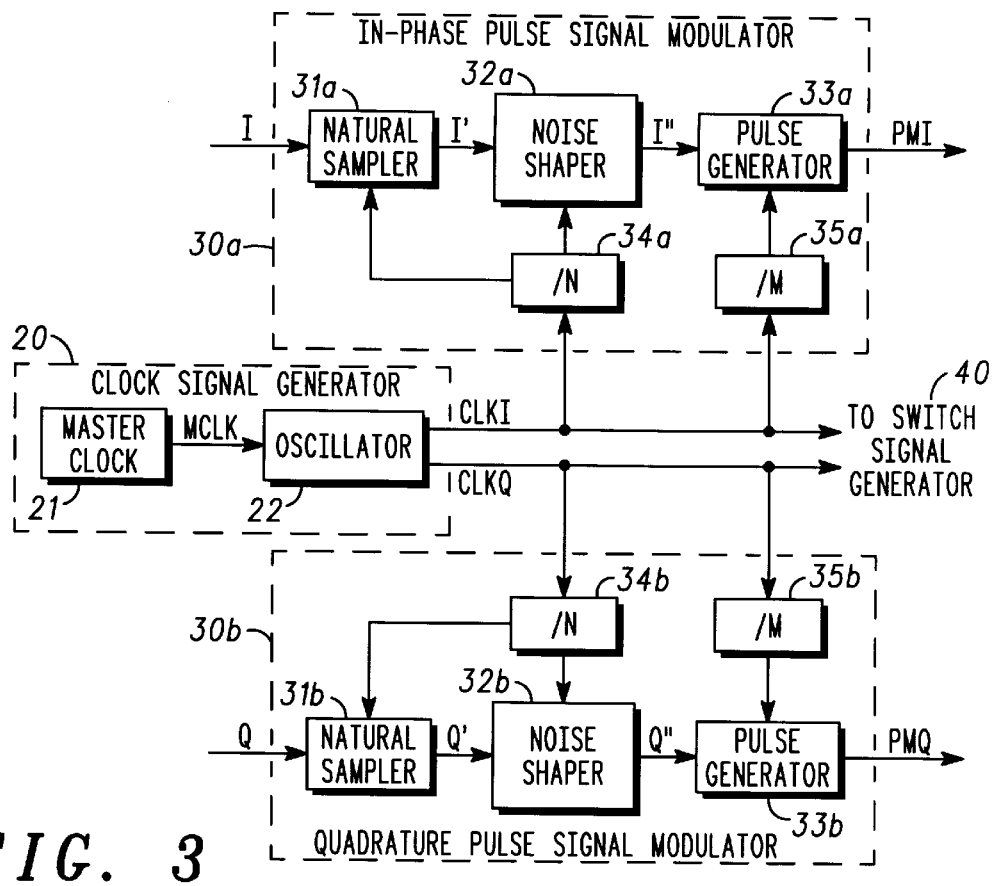
FIG. 3 illustrates a block diagram of one embodiment of a clock signal generator, and a pair of pulse signal modulators in accordance with the present invention.

In FIG. 3, one embodiment of the clock signal generator 20, one embodiment of the in-phase pulse signal modulator 30a, and one embodiment of the quadrature pulse signal modulator 30b are shown. The clock signal generator 20 includes a master clock 21 conventionally providing a master clock signal MCLK to a quadrature generator 22. In response thereto, the quadrature generator 22 provides the in-phase clock signal CLKI and the quadrature clock signal CLKQ, preferably as shown in FIG. 2. In alternative embodiments of the clock signal generator 20, the in-phase clock signal CLKI and the quadrature clock signal CLKQ may be identical or substantially identical whereby a quadrature delay can be employed within the switch signal generator 40 or embodiments thereof, or the RF signal generator 50 or embodiments thereof.

The in-phase pulse signal modulator 30a includes a natural sampler 31a, a noise shaper 32a, a pulse generator 33a, a divider 34a and a divider 35a. The divider 34a conventionally frequency divides the in-phase clock signal CLKI by a factor N (e.g., 2) and provides the result to the natural sampler 31a and the noise shaper 32a. The divider 35a conventionally frequency divides the in-phase clock signal CLKI by a factor M, (e.g., 1) and provides the result to the pulse generator 33a.

In response to the baseband signal I and a divided in-phase clock signal CLKI, the natural sampler 31a provides a baseband signal I' as a predistorted version of the baseband signal 1. As such, the natural sampler 31a can be based upon one of many conventional natural sampling techniques such as, for example, U.S. patent application Ser. No. 09/478,024 by Midya et al, filed Jan. 5, 2000, the entirety of which is hereby incorporated by reference. An operational embodiment of the natural sampler 31a, however, is predicated upon the operational requirements of a communication system or communication device including a modulated signal source in accordance with the present invention.

In response to the baseband signal I' and the divided in-phase clock signal CLKI, the noise shaper 32a conventionally provides a baseband signal I" as a version of the baseband signal I'. In one embodiment, the noise shaper 32a is designed in accordance with a U.S. patent application Ser. No. 09/478,013 that was filed Jan. 5, 2000, and is entitled "APPARATUS FOR NOISE SHAPING A PULSE WIDTH MODULATION (PWM) SIGNAL AND METHOD THEREFORE", the entirety of which is hereby incorporated by reference. An operational embodiment of the noise shaper 32a, however, is predicated upon the operational requirements of a communication system or communication device including a modulated signal source in accordance with the present invention.

In response to baseband signal I" and the divided in-phase clock signal CLKI, the pulse generator 33a conventionally provides the in-phase pulse modulated signal PMI. As such, the pulse generator 33a can be based upon one of many conventional pulse generation techniques such as, for example, pulse width modulation, pulse density modulation, pulse frequency modulation, pulse position modulation, click modulation, pulse code modulation, and pulse amplitude modulation. An operational embodiment of the pulse generator 33a, however, is predicated upon the operational requirements of a communication system or communication device including a modulated signal source in accordance with the present invention.

In alternative embodiments of the quadrature pulse signal modulator 30a, the natural sampler 31a may be omitted when the pulse generator 33a is based upon pulse density modulation, pulse code modulation, or pulse amplitude modulation.

The quadrature pulse signal modulator 30b includes a natural sampler 31b, a noise shaper 32b, a pulse generator 33b, a divider 34b and a divider 35b. The divider 34b conventionally frequency divides the quadrature clock signal CLKQ by a factor N (e.g., 2) and provides the result to the natural sampler 31b and the noise shaper 32b. The divider 35b conventionally frequency divides the quadrature clock signal CLKQ by a factor M (e.g., 1) and provides the result to the pulse generator 33b.

In response to the baseband signal Q and a divided clock signal CLKQ, the natural sampler 31b provides a baseband signal Q' as a predistorted version of the baseband signal Q. As such, the natural sampler 31b can be based upon one of many conventional natural sampling techniques such as, for example, U.S. patent application Ser. No. 09/478,024. An operational embodiment of the natural sampler 31b, however, is predicated upon the operational requirements of a communication system or communication device including a modulated signal source in accordance with the present invention.

In response to the baseband signal Q' and the divided clock signal CLKQ, the noise shaper 32b conventionally provides a baseband signal Q" as a version of the baseband signal Q'. In one embodiment, the noise shaper 32b is designed in accordance with a U.S. patent application Ser. No. 09/478,013. An operational embodiment of the noise shaper 32b, however, is predicated upon the operational requirements of a communication system or communication device including a modulated signal source in accordance with the present invention.

In response to baseband signal Q" and the divided clock signal CLKQ, the pulse generator 33b conventionally provides the pulse modulated signal PMQ. As such, the pulse generator 33b can be based upon one of many conventional natural sampling techniques such as, for example, pulse width modulation, pulse density modulation, pulse frequency modulation, pulse position modulation, click modulation, pulse code modulation, and pulse amplitude modulation. An operational embodiment of the pulse generator 33b, however, is predicated upon the operational requirements of a communication system or communication device including a modulated signal source in accordance with the present invention.

In alternative embodiments of the quadrature pulse signal modulator 30b, the natural sampler 31b may be omitted when the pulse generator 33b is based upon pulse density modulation, pulse code modulation, or pulse amplitude modulation.

Figure 4A:
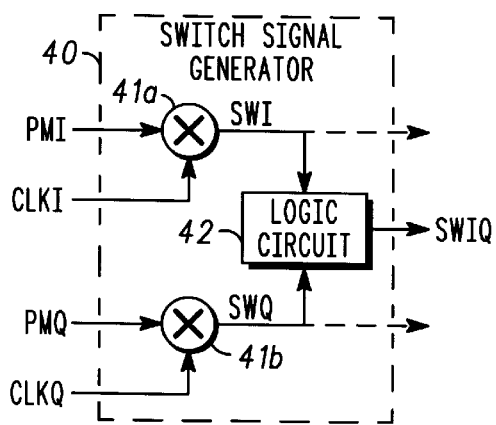
FIG. 4A illustrates a first embodiment of a switch signal generator in accordance with the present invention.

In FIG. 4A, one embodiment of the switch signal generator 40 is shown. The switch signal generator 40 includes a mixer 41a, a mixer 41b, and a logic circuit 42. In response to the in-phase pulse modulated signal PMI and the in-phase clock signal CLKI, the mixer 41a conventionally provides the in-phase switch signal SWI synchronized with the in-phase clock signal CLKI. In response to the quadrature pulse modulated signal PMQ and the quadrature clock signal CLKQ, the mixer 41b conventionally provides the quadrature switch signal SWQ synchronized with the quadrature clock signal CLKQ. In response to the in-phase switch signal SWI and the quadrature switch signal SWQ, the logic circuit 42 conventionally provides the switch signal SWIQ synchronized with the in-phase clock signal CLKI and the quadrature clock signal CLKQ. In an alternative embodiment of the switch signal generator 40, the logic circuit 40 can be omitted whereby the in-phase switch signal SWI and the quadrature switch signal SWQ are provided by the signal switch generator 40.

Figure 4B:
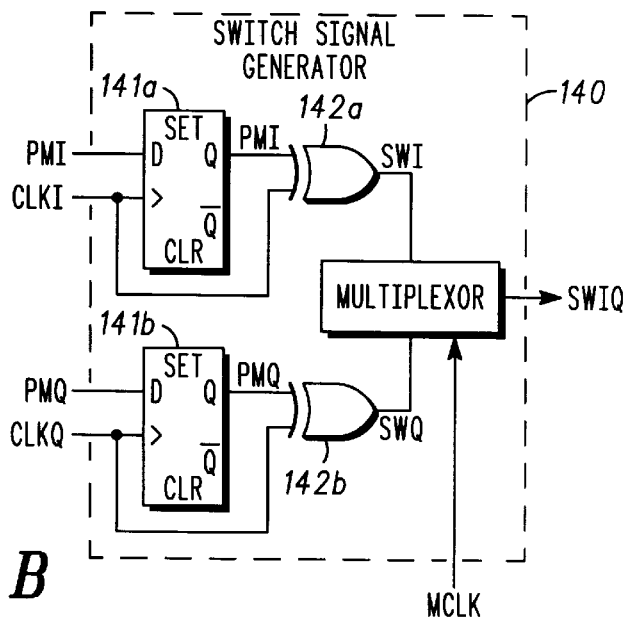
FIG. 4B illustrates a second embodiment of a switch signal generator in accordance with the present invention.

In FIG. 4B, an embodiment of a switch signal generator 140 is shown. The switch signal generator 140 includes a D flip-flop 141a, a D flip-flop 141b, an XOR gate 142a, an XOR gate 142b, and a multiplexor 143. The D flip-flop 141a conventionally provides the in-phase pulse modulated signal PMI in response to the in-phase pulse modulated signal PMI being applied to the input pin D and the in-phase clock signal CLKI being applied to the clock pin as shown. The XOR gate 142a conventionally provides the in-phase switch signal SWI in response to the in-phase pulse modulated signal PMI from the D flip-flop 141a and the in-phase clock signal CLKI. The D flip-flop 141b conventionally provides the quadrature pulse modulated signal PMQ in response to the quadrature pulse modulated signal PMQ being applied to the input pin D and the quadrature clock signal CLKQ being applied to the clock pin as shown. The XOR gate 142b conventionally provides the quadrature switch signal SWQ in response to the quadrature pulse modulated signal PMQ from the D flip-flop 141a and the quadrature clock signal CLKQ. In response to the master clock signal MCLK, the multiplexor 143 provides the in-phase switch signal SWIQ.

Figure 5A:
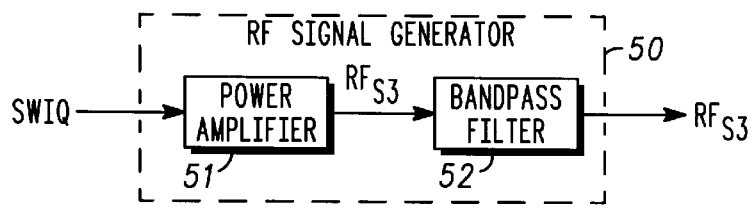
FIG. 5A illustrates a first embodiment of a RF signal generator in accordance with the present invention.

In FIG. 5A, one embodiment of the RF signal generator 50 is shown. The RF signal generator 50 includes a conventional switch mode amplifier 51 and a conventional bandpass filter 52. The switch mode amplifier 51 and the bandpass filter 52 collectively amplify and filter the in-phase switch signal SWIQ to obtain the modulated signal $RF_{S3}$. Operational embodiments of the switch mode amplifier 51 and the bandpass filter 52 are predicated upon the operational requirements (e.g., bandwidth) of a communication system or communication device including a modulated signal source in accordance with the present invention.

Figure 5B:
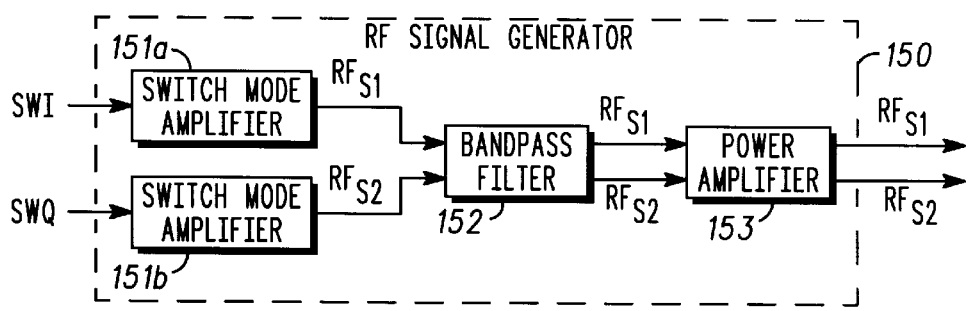
FIG. 5B illustrates a second embodiment of a RF signal generator in accordance with the present invention.

In FIG. 5B, an embodiment of a RF signal generator 150 is shown. The RF signal generator 150 includes a conventional switch mode amplifier 151a, a conventional switch mode amplifier 151b, a conventional bandpass filter 152 and a conventional power amplifier 153. The switch mode amplifier 151a, the bandpass filter 152, and the power amplifier 153 collectively amplify and filter the in-phase switch signal SWI to obtain the modulated signal $RF_{S1}$. The switch mode amplifier 151b, the bandpass filter 152, and the power amplifier 153 collectively amplify and filter the quadrature switch signal SWQ to obtain the modulated signal $RF_{S2}$. Operational embodiments of the switch mode amplifier 151a, the switch mode amplifier 151b, the bandpass filter 152, and the power amplifier 153 are predicated upon the operational requirements (e.g., bandwidth) of a communication system or communication device including a modulated signal source in accordance with the present invention.

Figure 6:
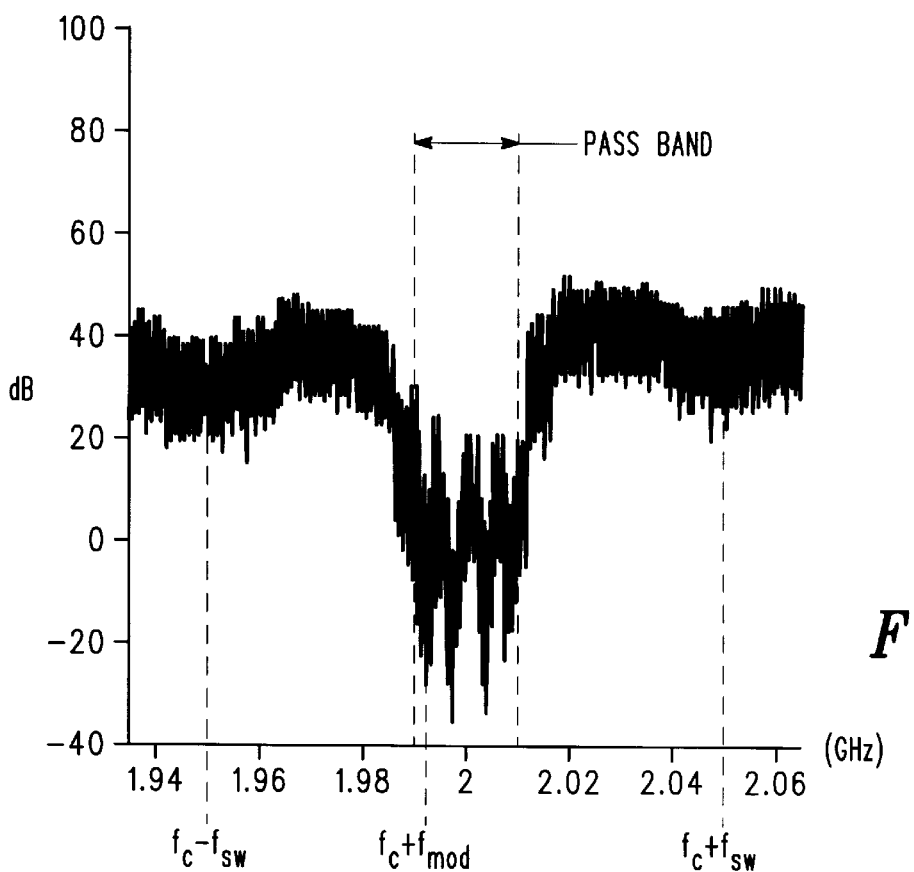
FIG. 6 is an exemplary spectrum of a bandpass filter of the RF signal generators of the FIGS. 5A and 5B.

In FIG. 6, an exemplary spectrum of an output of the invention employing pulse width modulation with a switching frequency $f_{sw}$ of 50 MHz and a carrier frequency $f_c$ of 2 GHz is shown. The passband is approximately 20 MHz. The system is excited with a complex test tone with a frequency $f_{mod}$ of −8 MHz.

The illustrated embodiments of the present invention as well as other embodiments of the present invention may be implemented in hardware, software, or combinations of hardware and software. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A communication method, comprising:
   receiving a first baseband signal in digital form;
   receiving a first clock signal;
   providing a first pulse modulated signal in digital form in response to a reception of the first baseband signal and a reception of the first clock signal,
   wherein the first clock signal and the first pulse modulated signal are synchronized
   receiving a second baseband signal in digital form;
   receiving, a second clock signal; and
   providing a second pulse modulated signal in digital form in response to a reception of the second baseband signal and a reception of the second clock signal,
   wherein the second clock signal and the second pulse modulated signal are synchronized.

2. The modulated signal method of claim 1, further comprising:
   providing a switch signal in digital form in response to a reception of the first clock signal and a reception of the first pulse modulated signal.

3. The modulated signal method of claim 2, wherein the first clock signal, the first pulse modulated signal, and the switch signal are synchronized.

4. The modulated signal method of claim 2, further comprising:
providing a modulated signal having a radio frequency in response to a filtering and an amplification of the switch signal.

5. The modulated signal method of claim 1, further comprising:
providing a first switch signal in digital form in response to a reception of the first clock signal and a reception of the first pulse modulated signal; and
providing a second switch signal in digital form in response to a reception of the second clock signal and a reception of the second pulse modulated signal.

6. The modulated signal method of claim 5,
wherein the first clock signal, the first pulse modulated signal, and the first switch signal are synchronized; and
wherein the second clock signal, the second pulse modulated signal, and the second switch signal are synchronized.

7. The modulated signal method of claim 5, further comprising:
providing a third switch signal in digital form as a function of the first switch signal and the second switch signal.

8. The modulated signal method of claim 7, further comprising:
providing a modulated signal having a radio frequency in response to a filtering and an amplification of the third switch signal.

9. A modulated signal source, comprising:
an oscillator operable to provide a first clock signal;
a first pulse signal modulator operable to provide a first pulse modulated signal in digital form in response to a reception of a first baseband signal and the first clock signal,
wherein the first clock signal and the first pulse modulated signal are synchronized;
a switch signal generator operable to provide a first switch signal in digital form in response to a reception of the first clock signal and the first pulse modulated signal,
wherein the first switch signal and the first clock signal are synchronized; and
a second signal generator operable to provide a second pulse modulated signal in digital form in response to a reception of a second baseband signal and a reception of a second clock signal;
wherein said oscillator is further operable to provide the second clock signal, and
wherein the second clock signal and the second pulse modulated signal are synchronized.

10. The modulated signal source of claim 1, wherein the first clock signal, the first pulse modulated signal, and the first switch signal are synchronized.

11. The modulated signal source of claim 1, further comprising:
a radio frequency signal generator operable to provide a modulated signal having a radio frequency in response to a reception of the first switch signal.

12. The modulated signal source of claim 1, further comprising:
a switch signal generator operable to provide a first switch signal in digital form in response to a reception of the first clock signal and the first pulse modulated signal, and
to provide a second switch in signal in digital form in response to a reception of a second clock signal and a second pulse modulated signal.

13. The modulated signal source of claim 1, further comprising:
a switch signal generator operable to provide a switch signal in digital form in response to a reception of the first clock signal, the first pulse modulated signal, the second clock signal and the second pulse modulated signal.

14. The modulated signal source of claim 13, further comprising:
a radio frequency signal generator operable to provide a modulated signal having a radio frequency in response to a reception of the switch signal.

15. The modulated signal source of claim 12,
wherein the first clock signal, the first pulse modulated signal, and the first switch signal are synchronized; and
wherein the second clock signal, the second pulse modulated signal, and the second switch signal are synchronized.

16. The modulated signal source of claim 15, further comprising:
a radio frequency signal generator operable to provide a first modulated signal having a radio frequency in response to a reception of the first switch signal, and to provide a second modulated signal having a radio frequency in response to a reception of the second switch signal.

17. A modulated signal method, comprising:
generating a first pulse modulated signal in response to a reception of a first clock signal and a first baseband signal, the first clock signal and the first pulse modulated signal being synchronized; and
generating a second pulse modulated signal in response to a reception of a second clock signal and a second baseband signal, the second clock signal and the second pulse modulated signal being synchronized.

18. A modulated signal source, comprising:
means for generating a first pulse modulated signal in response to a reception of a first clock signal and a first baseband signal, the first clock signal and the first pulse modulated signal being synchronized; and
means for generating a second pulse modulated signal in response to a reception of a second clock signal and a second baseband signal, the second clock signal and the second pulse modulated signal being synchronized.

19. A modulated signal source, comprising:
an oscillator operable to provide a first clock signal;
a first pulse signal modulator operable to provide a first pulse modulated signal in digital form in response to a reception of a first baseband signal and the first clock signal,
wherein the first clock signal and the first pulse modulated signal are synchronized
a switch signal generator operable to provide a first switch signal in digital form in response to a reception of the first clock signal and the first pulse modulated signal, and to provide a second switch signal in digital form in response to a reception of a second clock signal and a second pulse modulated signal.

* * * * *